United States Patent
Lee

(10) Patent No.: US 7,816,951 B1
(45) Date of Patent: Oct. 19, 2010

(54) LOCALLY BOOSTED TOP PLATE SAMPLING FOR A SAMPLING CAPACITOR

(75) Inventor: Bumha Lee, Pleasanton, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 41 days.

(21) Appl. No.: 12/249,512

(22) Filed: Oct. 10, 2008

(51) Int. Cl.
*G11C 27/02* (2006.01)

(52) U.S. Cl. ......................................... 327/94; 341/122

(58) Field of Classification Search .................... 327/91, 327/93, 94
See application file for complete search history.

(56) References Cited

U.S. PATENT DOCUMENTS

| | | | |
|---|---|---|---|
| 6,329,848 B1 * | 12/2001 | Maes et al. ..................... | 327/94 |
| 7,372,319 B1 | 5/2008 | Lee | |
| 7,453,291 B2 * | 11/2008 | Song ........................... | 327/91 |
| 7,532,042 B2 * | 5/2009 | Lee ............................. | 327/91 |
| 7,583,110 B2 * | 9/2009 | Butler ......................... | 327/112 |
| 7,626,622 B2 * | 12/2009 | Kasuga et al. ............... | 348/300 |

* cited by examiner

*Primary Examiner*—Long Nguyen
*Assistant Examiner*—Sibin Chen
(74) *Attorney, Agent, or Firm*—Patent Law Group LLP; Carmen C. Cook

(57) ABSTRACT

An analog sampling network (100) includes a sampling capacitor being coupled between a bottom plate sampling switch and a top plate sampling switch implemented as NMOS transistors. The top plate sampling switch has source/drain terminals coupled respectively to the sampling capacitor and a first reference voltage. The analog sampling network includes a top plate boosting circuit (150) providing a boosted gate voltage to a gate terminal of the top plate sampling switch during a sampling phase, the boosted gate voltage being the sum of a first voltage and a second voltage. The first voltage is approximately equal to the first reference voltage and tracks process, temperature, power supply voltage and biasing condition variations. The second voltage is a maximum operating voltage from the gate to drain/source terminal for a fabrication process used to fabricate the second MOS transistor.

11 Claims, 4 Drawing Sheets though the "on" resistance of transistor $M_B$ is kept small by the bootstrapping circuit, the "on" resistance of transistor $M_T$ could be large due to the lower $V_{GS}$ voltage. As a result, the total "on" resistance of both transistors $M_B$ and $M_T$ could be large which will in turn cause distortion when the input voltage $V_{IN}$ has a wide range and high frequency components. To keep the "on" resistance of transistor $M_T$ small and constant, voltage $V_{REFI}$ has to have a small variation over power supply, temperature, and process variations.

LOCALLY BOOSTED TOP PLATE SAMPLING FOR A SAMPLING CAPACITOR

FIELD OF THE INVENTION

The invention relates to switched capacitor circuits and, in particular, to a voltage boosting circuit for boosting the top plate sampling voltage for a sampling capacitor.

DESCRIPTION OF THE RELATED ART

As sampling clock rate and dynamic range of analog-to-digital converters (ADCs) increase and power supply voltage continues to decrease with deep sub-micron or even nanometer Complementary Metal Oxide Semiconductor (CMOS) fabrication processes in order to achieve higher operating rate and lower power dissipation and ultimately lower manufacturing and operation cost, it is becoming more difficult to design a highly linear analog sampling network using a switched capacitor circuit because of the lower effective gate to source voltage of the sampling transistors when the lower power supply voltages are used.

FIG. 1 is a circuit diagram of an exemplary switched capacitor circuit. Referring to FIG. 1, switched capacitor circuit 1 is configured as a single ended circuit. An analog input signal, $V_{IN}$, is sampled across a sampling capacitor $C_S$ while 0V is sampled across a feedback capacitor $C_F$ during the sampling clock period ($Q_S$ and $Q_{SE}$ active). The top plate sampling switch 2 (driven by clock $Q_{SE}$) turns off prior to the bottom plate sampling switch 3 (driven by clock $Q_S$). During the holding or amplification clock period ($Q_H$ active), the sampled charge on sampling capacitor $C_S$ is transferred onto feedback capacitor $C_F$ due to the negative feedback around an amplifier AMP. Therefore, the amplifier output voltage $V_{OUT}$ becomes $V_{IN} \times C_S/C_F$.

FIG. 2 is a circuit diagram of another exemplary switched capacitor circuit. Referring to FIG. 2, switched capacitor circuit 10 is configured as a differential input circuit. Differential analog input signals, $V_{IN}+$ and $V_{IN}-$, are sampled across sampling capacitors $C_S$ while 0V is sampled across corresponding feedback capacitors $C_F$ during the sampling clock period ($Q_S$ and $Q_{SE}$ active). The top plate sampling switch, implemented as NMOS transistors M1 and M2 and driven by clock $Q_{SE}$, turn off prior to the bottom plate sampling switches 13a and 13b (driven by clock $Q_S$). During the holding or amplification clock period ($Q_H$ active), the sampled charges on sampling capacitors $C_S$ are transferred onto feedback capacitors $C_F$ due to the negative feedback around amplifier AMP. Therefore, the amplifier output voltage $V_{OUT}+/-$ becomes $V_{IN}+/- \times C_S/C_F$.

Bootstrapping techniques have been widely used for the bottom plate sampling switch of the sampling capacitor to provide a boosted gate voltage to the bottom plate sampling switch. By boosting the gate voltage, the "on" resistance variation at the bottom plate sampling switch is minimized over the input signal range. Bootstrapping techniques fit well into the switched capacitor circuit design with low power supply voltage.

FIG. 3 is a circuit diagram of an exemplary analog sampling network forming part of the switched capacitor circuit. Referring to FIG. 3, analog sampling network 20 includes a sampling capacitor $C_S$ for sampling an analog input signal $V_{IN}$. A bottom plate sampling switch, implemented using an NMOS transistor $M_B$, is coupled to the bottom plate (or left side) of sampling capacitor $C_S$. A top plate sampling switch, implemented using an NMOS transistor $M_T$, is coupled to the top plate (or right side) of sampling capacitor $C_S$. During the sampling phase defined by the logically high period of clock signals $Q_S$ and $Q_{SE}$, transistors $M_B$ and $M_T$ are turned on to sample the analog input signal $V_{IN}$ onto sampling capacitor $C_S$. The top plate sampling switch $M_T$, controlled by clock $Q_{SE}$, turns off slightly prior to the bottom sampling switch $M_B$, controlled by clock $Q_S$, to prevent any input signal dependent charge injection. This sampling technique is referred to as bottom plate sampling. When the analog sampling network 20 is used in a switched capacitor circuit, the top plate of sampling capacitor $C_S$ (node 54) is coupled to the input terminal of the amplifier. The amplifier includes an NMOS input transistor pair receiving the input signal from sampling capacitor $C_S$.

In most applications, the top plate sampling switch $M_T$ is connected between the top plate of sampling capacitor $C_S$ and a voltage $V_{REFI}$ (node 56). When applied in a switched capacitor circuit, voltage $V_{REFI}$ is the input common mode voltage of the amplifier. Circuit block 60 in FIG. 3 illustrates an exemplary circuit for generating the input common voltage $V_{REFI}$. In circuit block 60, input common mode voltage $V_{REFI}$ is the node voltage connected to both the common gate node of cascaded NMOS transistors $M_{11}$ and $M_{12}$ and further to the drain node of transistor $M_{12}$. A bias current $I_B$, provided by a current source 62, flows though transistors $M_{11}$ and $M_{12}$.

In the implementation shown in FIG. 3, a bottom plate bootstrapping circuit 52 is applied to boost the gate voltage of bottom plate sampling switch $M_B$. The bootstrapping circuit 52 includes a bootstrap capacitor $C_{BS}$ and switches 21-24 controlled by the clock signal $Q_S$ and its inverse $Q_{SB}$. The bootstrapping circuit operates as follows. A fixed voltage, such as $V_{DD}$, is sampled across bootstrap capacitor $C_{BS}$ during the $Q_{SB}$ clock phase, which is the opposite clock phase of clock $Q_S$. Then, during the $Q_S$ clock phase, capacitor $C_{BS}$ is connected between the gate and drain terminal of transistor $M_B$. The drain terminal of transistor $M_B$ is coupled to the input voltage $V_{IN}$. Accordingly, the gate voltage of transistor $M_B$ follows input voltage $V_{IN}$ and is shifted up by the $V_{DD}$ voltage as long as capacitor $C_{BS}$ is much larger than the gate capacitance of transistor $M_B$. As the result of the bootstrap voltage applied by capacitor $C_{BS}$, the "on" resistance of transistor $M_B$ remains constant regardless of the magnitude of the input voltage $V_{IN}$, at least for the first order. There is a small higher order non-linearity due to the secondary effects of an NMOS transistor, such as body effect and voltage dependent drain-to-substrate and/or source-to-substrate junction capacitance, where the secondary effects are not being considered here.

In the analog sampling network shown in FIG. 3, the signal path from the input voltage $V_{IN}$ through the drain-to-source terminals of bottom plate sampling switch $M_B$, through capacitor $C_S$ and through the drain-to-source terminals of top plate sampling switch $M_T$ and down to voltage $V_{REFI}$ (node 56) is the critical signal path for the sampling network. On the other hand, switches 22 and 24 in the bootstrap circuit 52, controlled by clock signal $Q_{SB}$, are not on the critical signal path. Long term reliability for these switches could be ensured by either using low speed but high voltage transistor devices if available or by appropriately cascading transistors.

The situation with top plate sampling switch $M_T$ is different compared to that of bottom plate sampling switch $M_B$. First of all, the "on" resistance of transistor $M_T$ is constant regardless of the magnitude of input voltage $V_{IN}$ as long as the "on" resistance of transistor $M_T$ is small and voltage $V_{REFI}$ does not change instantaneously. Secondly, common mode voltage $V_{REFI}$ tracks power supply, temperature and process variations and thus does not behave as a fixed common mode for input voltage $V_{IN}$. The total "on" resistance of both transistors $M_B$ and $M_T$ has to be small and consistent over the voltage range of input voltage $V_{IN}$ in order to maintain a high linearity for the sampling network. If the total "on" resistance is too large or varies, distortion at a high input frequency may occur due to the inherent non-linearity of both transistors $M_B$ and $M_T$.

Other design issues for the top plate sampling switch are as follows. First, in conventional analog sampling networks, the gate voltage of transistor $M_T$ is not bootstrapped but is driven to a constant voltage, such as the power supply voltage, when clock $Q_{SE}$ is active high. When an attenuated input signal $V_{IN}$ is presented across the drain-source node of transistor $M_T$ at a high input frequency, non-linear charge injection from transistor $M_T$ during clock phase $Q_{SE}$ results in deteriorated linearity. Second, the power supply voltage decreases for smaller geometry CMOS processes due to the lower breakdown voltage from gate to substrate or the lower tunneling voltage from drain to source node of the transistor. But as the power supply voltage decreases, the threshold voltage of the transistors does not decrease as fast as the supply voltage reduction mainly to maintain low leakage current between the source/drain terminals.

Furthermore, when voltage $V_{REFI}$ is close to half of the power supply voltage, the amount of effective voltage from the gate to source terminals of transistor $M_T$ becomes smaller. Consequently, the "on" resistance of transistor $M_T$ becomes larger instead of smaller as the geometry of CMOS processes becomes finer. However, the "on" resistance of transistor $M_T$ needs to be smaller to accommodate higher frequency sampling.

While it is possible to resolve the above issues by simply increasing the channel length of transistor $M_T$. However, an increased channel length transistor $M_T$ increases the amount of switching and supply noise. Also, a larger $M_T$ transistor increases the amount of charge injection at the moment when the transistor is turning off so that the input common mode voltage of the gain amplifier actually gets moved down. It becomes harder to compensate for the increased charge injection with a dummy transistor connected to an inverted clock of $Q_S$ because larger switch size for both transistors increases the absolute mismatch between the two transistors. The mismatch issue becomes more severe with narrower headroom margin of the amplifier at lower power supply voltage. Lastly, the larger dummy transistor requires an amplifier with wider bandwidth and higher DC gain to compensate the reduced feedback factor ($\beta$) so that the amplifier has to consume more power. Input referred noise increases as $\beta$ decreases with gaining nothing at a given signal transfer gain.

When transistor $M_T$ is driven directly from the power supply voltage, the voltage of the gate to drain-source node of transistor $M_T$ is dependent on the change of supply voltage so that the "on" resistance of transistor $M_T$ increases with low supply voltage. Accordingly, it is hard to optimize the linearity of the sampling network and the tight input common mode control at same time over a wide operating range of power supply voltages.

One solution to decreasing the "on" resistance of transistor $M_T$ without increasing its channel width is to use a fixed boosted voltage $V_{BOOST}$ higher than the power supply $V_{DD}$ voltage to drive the gate terminal of transistor $M_T$ during the clock phase $Q_S$. FIG. 4 illustrates one exemplary circuit for generating such a boosted voltage. Referring to FIG. 4, a dedicated charge pump 82 drives a non-inverting negative feedback circuit formed by an amplifier 84 and two resistors $R_1$ and $R_2$. The output voltage of charge pump 82 has to be higher than voltage $V_{BOOST}$ for the headroom margin of the amplifier 84. In the example shown in FIG. 4, the output voltage of charge pump 82, denoted $V_{CP}$, is set to close to 2 times of the power supply $V_{DD}$ voltage, assuming that the amount of average sinking current through the feedback circuit is negligibly smaller than that of the sourcing current from the charge pumping capacitor $C_{CP2}$. For instance, a voltage $V_{BOOST}$ of 2.3V can be generated with the configuration of $V_{REF}$=1.0V and $R_2$=1.3×$R_1$. Voltage $V_{BOOST}$ is given as $(R_1+R_2)/R_1 * V_{REF}$. The maximum gate voltage for transistor $M_T$ can be higher than 2.3V with a given $V_{REFI}$, but 2.3V is already higher than the maximum voltage of operating supply range of a common 0.18 um CMOS process.

The method of generating a boost voltage shown in FIG. 4 has many shortcomings. First, the boosted voltage $V_{BOOST}$ is a constant DC voltage independent of the power supply voltage, process and temperature variations only when the reference voltage $V_{REF}$ is a constant voltage. Even if voltage $V_{REF}$ tracks all three variations completely, voltage $V_{BOOST}$ could not match all three variations directly because of the amplification gain of the feedback circuit. Second, the switches connected to the charge pump voltage $V_{CP}$ node is exposed to a high voltage, which is even higher than voltage $V_{BOOST}$. The long term reliability of devices is more susceptible whenever voltage at any node is high. Maximum voltage of every node has to be kept as low as possible for every transistor to be reliable. Third, the clock jitter of the sampling network increases due to the wide bandwidth of voltage $V_{BOOST}$ and the components on the signal path in the feedback circuit during clock $Q_S$. Fourth, a level shift circuit might be required to transfer the control clock signal from the clock signal chain to the gate of transistor $M_T$ when voltage $V_{BOOST}$ is higher than the power supply $V_{DD}$ voltage and the difference between two is larger than the threshold voltage of NMOS/PMOS transistor. Lastly, the high voltage $V_{CP}$ and the static current flowing through the feedback circuit causes power dissipation with low efficiency.

In summary, as supply voltage decreases with smaller geometry CMOS processes, it is becoming more difficult to keep the "on" resistance of top plate sampling switch of a switched capacitor sampling network low. Bootstrapping techniques have been used for the bottom plate sampling switch but the linearity of the sampling network starts to be limited by the top plate sampling switch at low supply and high frequency input signals.

DETAILED DESCRIPTION OF THE PREFERRED EMBODIMENTS

In accordance with the principles of the present invention, an analog sampling network for a switched capacitor circuit including a sampling capacitor and bottom plate and top plate sampling switches incorporates a top plate boosting circuit to boost the drive voltage of the top plate sampling switch. In this manner, the "on" resistance of the top plate sampling switch is kept small while the size of the switch is also kept small. More specifically, the gate voltage of the top plate sampling switch is driven to an optimal value and the maximum possible gate voltage is used for a given fabrication process regardless of power supply voltage, process, temperature and bias current variations by tracking these variable all at once. The top plate boosting circuit allows the maximum possible gate voltage to be used without damaging the top plate sampling switch. Furthermore, neither a local charge pump nor a feedback circuit is required.

Figure 1:
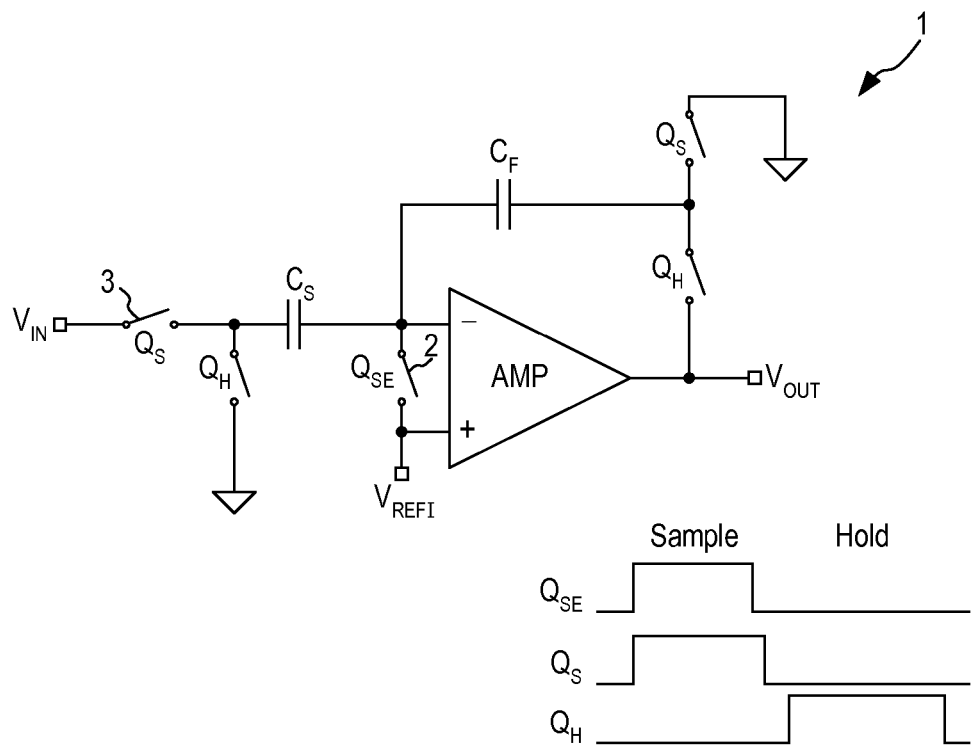
FIG. 1 is a circuit diagram of an exemplary switched capacitor circuit.
Figure 2:
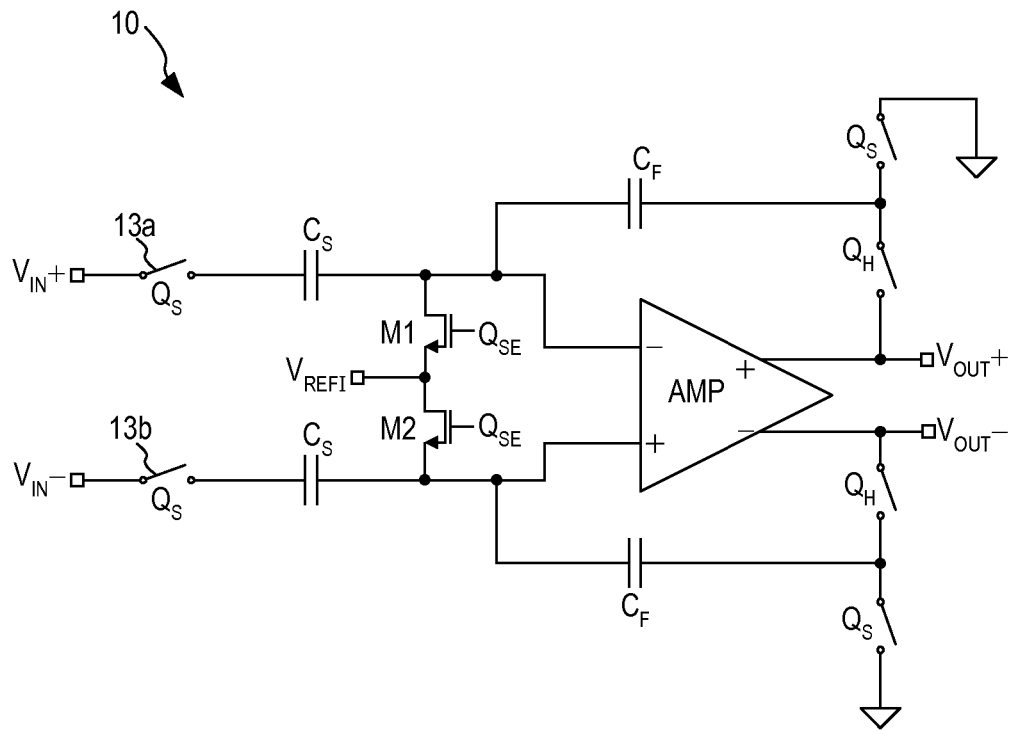
FIG. 2 is a circuit diagram of another exemplary switched capacitor circuit.
Figure 3:
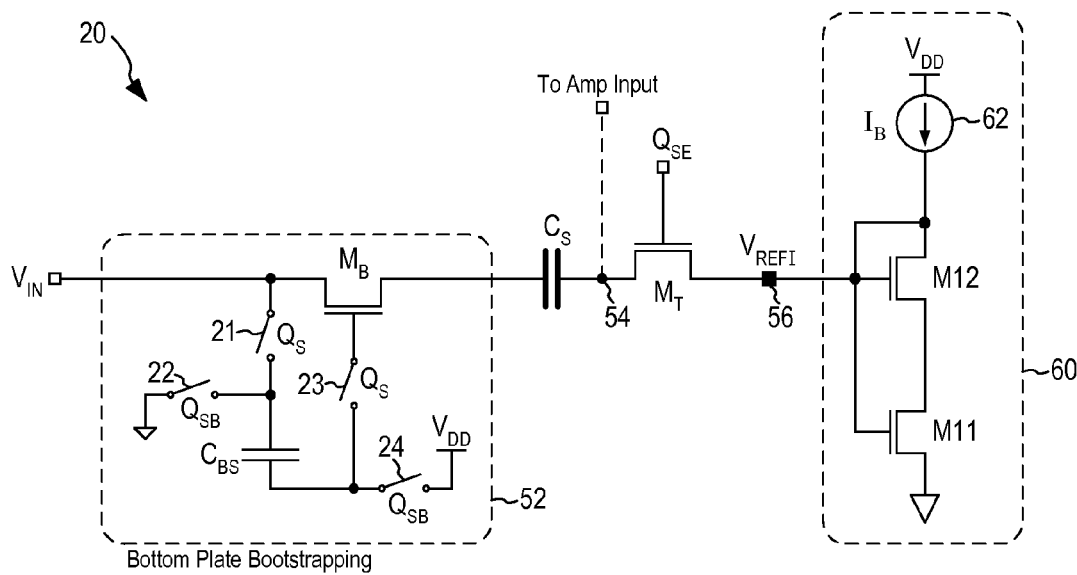
FIG. 3 is a circuit diagram of an exemplary analog sampling network forming part of the switched capacitor circuit.
Figure 3:
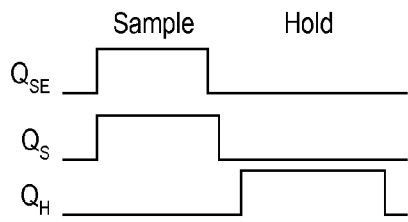
Figure 4:
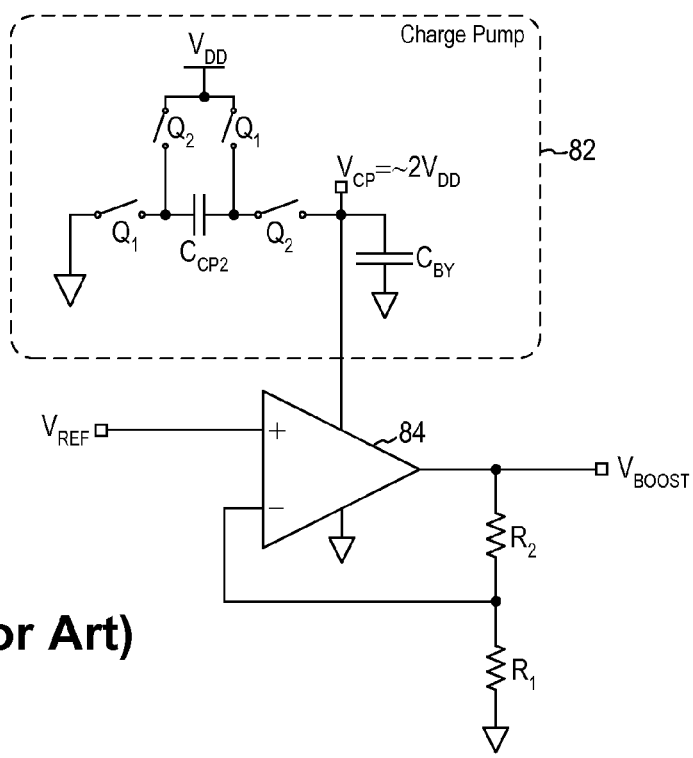
FIG. 4 illustrates one exemplary circuit for generating such a boosted voltage.
Figure 5:
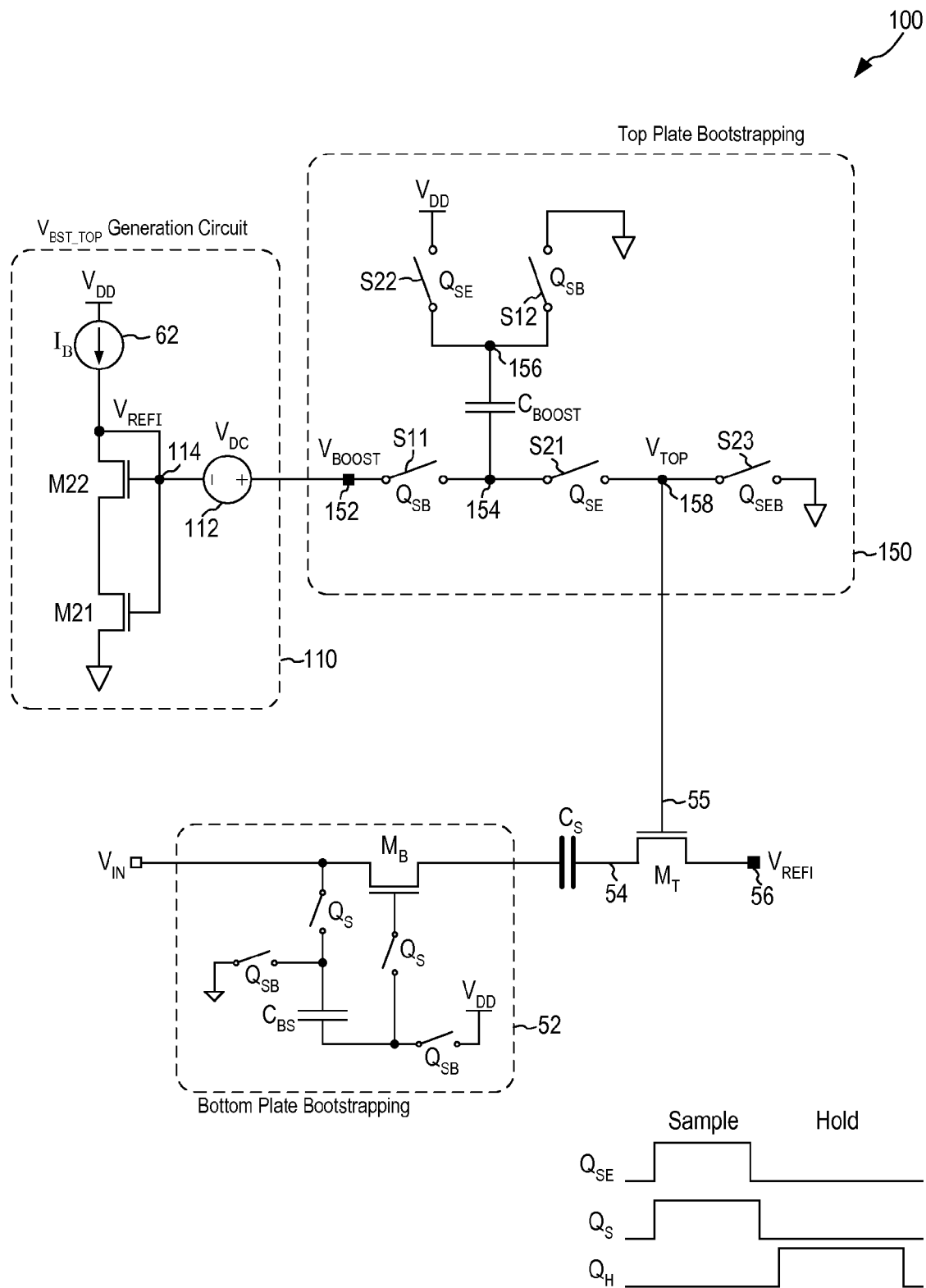
FIG. 5 is a circuit diagram of a top plate boosting circuit incorporated in an analog sampling network according to one embodiment of the present invention.

FIG. 5 is a circuit diagram of a top plate boosting circuit incorporated in an analog sampling network according to one embodiment of the present invention. Referring to FIG. 5, analog sampling network 100 includes a sampling capacitor $C_S$ for sampling an analog input signal $V_{IN}$. A bottom plate sampling switch, implemented using an NMOS transistor $M_B$, is coupled to the bottom plate (or left side) of sampling capacitor $C_S$. A top plate sampling switch, implemented using an NMOS transistor $M_T$, is coupled to the top plate (or right side) of sampling capacitor $C_S$. During the sampling phase defined by the logically high period of clock signals $Q_S$ and $Q_{SE}$, transistors $M_B$ and $M_T$ are turned on to sample the analog input signal $V_{IN}$ onto sampling capacitor $C_S$. The top plate sampling switch $M_T$, controlled by clock $Q_{SE}$, turns off slightly prior to the bottom sampling switch $M_B$, controlled by clock $Q_S$, to prevent any input signal dependent charge injection.

When the analog sampling network 100 is used in a switched capacitor circuit, the top plate of sampling capacitor $C_S$ (node 54) is coupled to the input terminal of the amplifier. In most applications, the top plate sampling switch $M_T$ is connected between the top plate of sampling capacitor $C_S$ and a voltage $V_{REFI}$ (node 56). When applied in a switched capacitor circuit, voltage $V_{REFI}$ is the input common mode voltage of the amplifier.

Analog sampling network 100 is shown with a bottom plate bootstrapping circuit 52 for boosting the gate voltage of the bottom plate sampling switch $M_B$. The bottom plate bootstrapping circuit and its exact configuration thereof is not critical to the practice of the present invention. Any bootstrapping circuit can be used to boost the gate voltage of the bottom plate sampling switch in the analog sampling network 100 of the present invention.

In the present embodiment, analog sampling network 100 includes a boost voltage generation circuit 110 and a top plate boosting circuit 150 operating in conjunction to generate a boosted gate voltage $V_{TOP}$ for the top plate sampling switch $M_T$. The boosted gate voltage $V_{TOP}$ has a maximum value that is within the reliability limit of transistor $M_T$. In one embodiment, the boosted gate voltage $V_{TOP}$ is the sum of the common mode voltage $V_{REFI}$ and a voltage $V_{MAX}$. Voltage $V_{MAX}$ is maximum operating voltage for a given fabrication process. In one embodiment, voltage $V_{MAX}$ is maximum operating voltage that can be applied across the gate to drain/source terminal of transistor $M_T$ for a given fabrication process without negatively affecting the reliability of the transistor.

In the present embodiment, boost voltage generation circuit 110 generates a boosted voltage $V_{BOOST}$ that not a fixed voltage but rather is the sum of the common mode voltage $V_{REFI}$ and a fixed DC voltage $V_{DC}$ from a voltage source 112. Boost voltage generation circuit 100 uses the same circuitry as in circuit block 60 for generating the common mode voltage $V_{REFI}$. That is, common mode voltage $V_{REFI}$ (node 114) is generated using a bias current source 62 providing a current $I_B$ to cascaded NMOS transistors $M_{11}$ and $M_{12}$. The common mode voltage $V_{REFI}$ is added to the fixed DC voltage $V_{DC}$ to form the boosted voltage $V_{BOOST}$ (node 152).

At the top plate boosting circuit 150, the boosted voltage $V_{BOOST}$ is sampled onto a capacitor $C_{BOOST}$ during the clock phase defined by clock signal $Q_{SB}$. Clock phase $Q_{SB}$ is the inverted clock phase of clock signal $Q_S$. Clock signal $Q_S$ is active during the sampling phase of sampling capacitor $C_S$. Thus, clock signal $Q_{SB}$ is active outside of the sampling phase, that is, when sampling capacitor $C_S$ is not sampling the input voltage $V_{IN}$. During the clock phase $Q_{SB}$, a first plate (node 154) of capacitor $C_{BOOST}$ is connected to the boosted voltage $V_{BOOST}$ (node 152) through a switch S11 and a second plate (node 156) of capacitor $C_{BOOST}$ is referenced to ground through a switch S12.

Then, during the clock phase defined by clock signal $Q_{SE}$, switches S11 and S12 are open while switches S21 and S22 are closed. Clock signal $Q_{SE}$ is the same as the sampling clock signal QS but is deactivated earlier to prevent input signal dependent charge injection. When clock signal $Q_{SE}$ is active, the first plate (node 154) of capacitor $C_{BOOST}$ is connected through switch S21 to the output node 158 providing the boosted gate voltage $V_{TOP}$. The second plate (node 156) of capacitor $C_{BOOST}$ is connected through switch S22 to the power supply $V_{DD}$ voltage. When the second plate (node 156) of capacitor $C_{BOOST}$ is connected to the $V_{DD}$ voltage, the voltage value at the first plate (node 154) of capacitor $C_{BOOST}$ is pushed up by the $V_{DD}$ voltage as well. As a result, a boosted gate voltage $V_{TOP}$ is provided to drive the gate terminal of transistor $M_T$, being the top side sampling switch for sampling capacitor $C_S$. A switch S23, controlled by the inverse of the clock signal $Q_{SE}$, operates to discharge the boosted gate voltage $V_{TOP}$ outside of the sampling phase of the analog sampling network.

In the boosted voltage generation circuit 110, the common mode voltage $V_{REFI}$ thus generated automatically tracks fabrication process variation as well as temperature and bias current ($I_B$) changes. The boosted voltage $V_{BOOST}$ is the sum of the common mode voltage $V_{REFI}$ and the DC voltage $V_{DC}$ (Eq. (1)). If voltage $V_{DC}$ is equal to voltage $V_{MAX}$ subtracted by $V_{DD}$ (Eq. (2)), then the boosted gate voltage $V_{TOP}$ will be given as $V_{REFI}$ plus $V_{MAX}$ of transistor $M_T$ (Eq. (3)) during the sample clock phase $Q_S$. The voltage relationships are expressed as follows:

$$V_{BOOST} = V_{REFI} + V_{DC}; \qquad \text{Eq. (1)}$$

$$V_{DC} = V_{MAX} - V_{DD}; \qquad \text{Eq. (2)}$$

$$\begin{aligned} V_{TOP} &= V_{BOOST} + V_{DD} & \text{Eq. (3)} \\ &= V_{REFI} + V_{DC} + V_{DD} \\ &= V_{REFI} + V_{MAX}. \end{aligned}$$

As thus generated, voltage $V_{TOP}$ is proportional to process variation, temperature and bias current $I_B$ changes, as well as supply voltage variation.

Another feature of the top plate boosting circuit is that the gate terminal of transistor $M_T$ is driven by the power supply $V_{DD}$ voltage through capacitor $C_{BOOST}$ instead of through voltage $V_{BOOST}$ during the sampling clock phase (clock signal $Q_S$). Accordingly, voltage $V_{TOP}$ (node 158) can settle down at the final voltage level quickly. The total integrated noise of voltage $V_{BOOST}$ can be made small by making the bandwidth of voltage $V_{BOOST}$ as narrow as possible. Even though the final voltage across capacitor $C_{BOOST}$ is not completely settled down at the end of the sampling period defined by clock $Q_{SB}$ due to the narrow bandwidth of voltage $V_{BOOST}$. voltage $V_{TOP}$ is not drifting but is level shifted by the amount of voltage sampled on capacitor $C_{BOOST}$ from the power supply $V_{DD}$ voltage. In fact, the amount of charge to be provided by voltage $V_{BOOST}$ onto capacitor $C_{BOOST}$ is just the amount of residual charge loss from the switches around capacitor $C_{BOOST}$ between the clock period $Q_{SE}$ and $Q_{SB}$, and the residual charge is a small amount.

Figure 6:
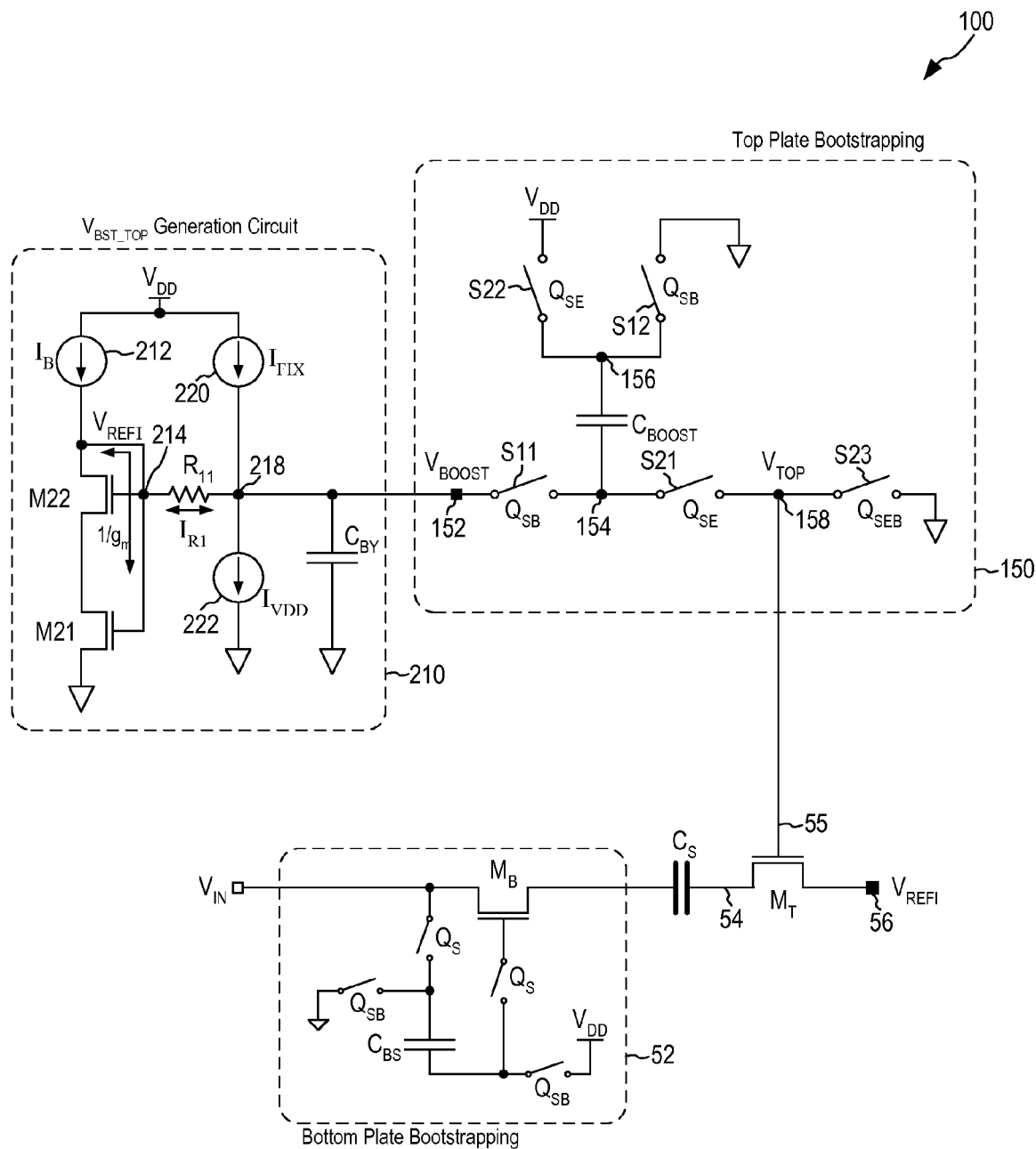
FIG. 6 is a circuit diagram of a top plate boosting circuit incorporated in an analog sampling network according to an alternate embodiment of the present invention.

FIG. 6 illustrates an implementation of the boost voltage generation circuit for providing a boosted voltage to the top plate boosting circuit for use in the analog sampling network according to one embodiment of the present invention. Referring to FIG. 6, the voltage source providing voltage $V_{DT}$ is implemented using a first current source 220 providing a current $I_{FIX}$ and a second current source 222 providing a current $I_{VDD}$, and a resistor R. Current source 220 and current source 222 are connected in series between the power supply $V_{DD}$ voltage and the ground voltage. Resistor $R_{11}$ is connected to the common mode voltage $V_{REFI}$ node 214 and the common node 218 between the two current sources.

The value "$1/g_m$" is the impedance as seen from the common node voltage $V_{REFI}$ node 214 toward the diode connected cascaded transistors $M_1$ and $M_2$. The $1/g_m$ impedance has to be small enough in order to hold the top plate node 54 of sampling capacitor $C_S$ at a solid constant voltage even in the presence of a large amount of charge injection from transistors $M_T$ and $M_B$ at the beginning of clock signals $Q_S$ and $Q_{SE}$. When the serially connected resistor $R_{11}$ is much larger than $1/gm$ and currents $I_{FIX}$ and $I_{VDD}$ are $V_{MAX}/R_{11}$ and $V_{DD}/R_{11}$, respectively, the current $I_{R1}$ flowing through resistor $R_{11}$ is $(V_{MAX}-V_{DD})/R_{11}$. The boosted voltage $V_{BOOST}$ is given as:

$$V_{BOOST}=V_{REFI}+V_{MAX}-V_{DD}.$$

In the present embodiment, voltage $V_{MAX}$ could be equal to or greater than the power supply $V_{DD}$ voltage. A constant reference voltage $V_{REF}$ from a bandgap reference circuit can be used to generate current $I_{FIX}$ with appropriate ratio of resistors. That is:

$$V_{MAX}=V_{REF} \cdot R_2/R_{11},$$

$$I_{FIX}=V_{MAX}/R_{11}=V_{REF} \cdot R_2/(R_{11})^2.$$

The resistor value of $R_2$ is the function of voltage $V_{MAX}$, voltage $V_{REF}$ and resistor $R_{11}$ as shown above.

A large bypass capacitor $C_{BY}$ is added to the boosted voltage output node 218 to reduce the bandwidth of voltage $V_{BOOST}$ for small total integrated noise and to provide strong drive capability for capacitor $C_{BOOST}$ without using any dedicated power hungry and noisy amplifier.

In conclusion, as CMOS fabrication processes move toward finer geometry for faster and lower power supply voltage, and accordingly lower power dissipation and higher level system integration into a single device, it is becoming more difficult to keep the "on" resistance of a top plate sampling switch low without increasing the channel width of the switch. This is particularly problematic when the threshold voltage is not scaling down as aggressively as the power supply voltage. The top plate boosting circuit and method of the present invention consumes less power and introduces lower total integrated noise. Furthermore, the top plate boosting circuit and method of the present invention enables the gate voltage of the top plate sampling transistor $M_T$ to be driven by an optimal and maximum voltage with a given fabrication process technology and the gate voltage is independent of process and temperature variations as well as supply voltage and bias current changes.

The above detailed descriptions are provided to illustrate specific embodiments of the present invention and are not intended to be limiting. Numerous modifications and variations within the scope of the present invention are possible. The present invention is defined by the appended claims.

I claim:

1. An analog sampling network (100) including a sampling capacitor ($C_S$) for sampling an analog input voltage ($V_{IN}$), the sampling capacitor being coupled between a bottom plate sampling switch ($M_B$) and a top plate sampling switch ($M_T$) implemented as respective first and second NMOS transistors, the bottom plate sampling switch having source and drain terminals coupled respectively to the analog input voltage and one plate of the sampling capacitor, the top plate sampling switch having source and drain terminals coupled respectively to the other plate of the sampling capacitor and a first reference voltage ($V_{REFI}$), the analog sampling network comprising:
   a top plate boosting circuit (150) providing a boosted gate voltage ($V_{TOP}$) to a gate terminal of the top plate sampling switch during a sampling phase of the analog sampling network, the boosted gate voltage being the sum of a first voltage and a second voltage ($V_{MAX}$),
   wherein the first voltage has a value approximately equal to the first reference voltage and the first voltage tracks fabrication process, temperature, power supply voltage and biasing condition variations, and the second voltage is a maximum operating voltage from the gate to drain or gate to source terminal for a fabrication process used to fabricate the second MOS transistor.

2. The analog sampling network of claim 1, further comprising:
   a boost voltage generation circuit (110) generating a boosted voltage ($V_{BOOST}$), the boosted voltage being the sum of the first reference voltage and a third voltage ($V_{DC}$), the third voltage being the second voltage less a positive power supply voltage, the booted voltage being applied to the top plate boosting circuit to generate the boosted gate voltage.

3. The analog sampling network of claim 2, wherein the top plate boosting circuit comprises a first capacitor ($C_{BOOST}$) being precharged to the boosted voltage outside of the sampling phase of the analog sampling network, and the precharged first capacitor being coupled across the positive power supply voltage and an output node (158) providing the boosted gate voltage, the precharged voltage across the first capacitor being pushed up by the positive power supply voltage to generate the boosted gate voltage being the sum of the first voltage and the second voltage.

4. The analog sampling network of claim 3, wherein the top plate boosting circuit further comprises:
   a first switch (S11) coupled between the boosted voltage and a first plate (154) of the first capacitor, the first switch being controlled by a first clock signal being an inverse of the sampling phase of the analog sampling network;
   a second switch (S12) coupled between a second plate (156) of the first capacitor and a ground voltage, the second switch being controlled by the first clock signal;
   a third switch (S21) coupled between the first plate of the first capacitor and the output node (158), the third switch being controlled by a second clock signal indicating the sampling phase of the analog sampling network; and
   a fourth switch (S22) coupled between the second plate of the first capacitor and the positive power supply voltage, the fourth switch being controlled by the second clock signal.

5. The analog sampling network of claim 4, wherein the top plate boosting circuit further comprises a fifth switch (S23) coupled between the output node and the ground voltage, the fifth switch being controlled by a third clock signal being an inverse of the sampling phase of the analog sampling network.

6. The analog sampling network of claim 1, wherein the first reference voltage comprises a common mode voltage of an amplifier to which the analog sampling network is coupled.

7. The analog sampling network of claim 2, wherein the boost voltage generation circuit comprises:
a third transistor (M22), being diode-connected, and a fourth transistor (M21) connected in series between a bias current source (212) providing a bias current and the ground voltage, the first reference voltage being developed at a node between the bias current source and the third transistor;
a first current source (220) providing a first current and a second current source (222) providing a second current, the first and second current sources being connected in series between the positive power supply voltage and the ground voltage;
a resistor connected between a gate terminal of the third transistor and a common node (218) between the first current source and the second current source, the common node being an output node of the boost voltage generation circuit providing the boosted voltage; and
a bypass capacitor connected between the output node of the boost voltage generation circuit and the ground voltage.

8. The analog sampling network of claim 1, wherein the second voltage comprises a maximum operating voltage that can be applied across the gate to drain or gate to source terminal of the second MOS transistor fabricated using a given fabrication process without negatively affecting the reliability of the second MOS transistor.

9. A method in an analog sampling network (100) including a sampling capacitor ($C_S$) for sampling an analog input voltage ($V_{IN}$), the sampling capacitor being coupled between a bottom plate sampling switch ($M_B$) and a top plate sampling switch ($M_T$) implemented as respective first and second NMOS transistors, the top plate sampling switch having source and drain terminals coupled respectively to the sampling capacitor and a first reference voltage ($V_{REF1}$), the method comprising:
generating a first voltage having a value approximately equal to the first reference voltage and tracking tracks fabrication process, temperature, power supply voltage and biasing condition variations;
determining a second voltage being a maximum operating voltage from the gate to drain or gate to source drain/source terminal for a fabrication process used to fabricate the second MOS transistor;
generating a third voltage ($V_{DC}$) being the second voltage less a positive power supply voltage;
generating a boosted voltage ($V_{BOOST}$) being the sum of the first voltage and the third voltage;
precharging a first capacitor with the boosted voltage outside of a sampling phase of the analog sampling network;
connecting the precharged first capacitor across an output node and a positive power supply voltage during the sampling phase of the analog sampling network, the precharged voltage across the first capacitor being pushed up by the positive power supply voltage to generate a boosted gate voltage ($V_{TOP}$) being the sum of the first voltage and the second voltage; and
applying the boosted gate voltage to a gate terminal of the top plate sampling switch during the sampling phase of the analog sampling network.

10. The method of claim 9, wherein the first reference voltage comprises a common mode voltage of an amplifier to which the analog sampling network is coupled.

11. The method of claim 9, wherein the second voltage comprises a maximum operating voltage that can be applied across the gate to drain or gate to source terminal of the second MOS transistor fabricated using a given fabrication process without negatively affecting the reliability of the second MOS transistor.

* * * * *

UNITED STATES PATENT AND TRADEMARK OFFICE
CERTIFICATE OF CORRECTION

PATENT NO. : 7,816,951 B1
APPLICATION NO. : 12/249512
DATED : October 19, 2010
INVENTOR(S) : Bumha Lee It is certified that error appears in the above-identified patent and that said Letters Patent is hereby corrected as shown below:

Column 10
Claim 9, Lines 7-8, where "tracking tracks fabrication" should read --tracking fabrication--.
Claim 9, Lines 11-12, where "to source drain/source terminal" should read --to source terminal--.

Signed and Sealed this
Eighth Day of March, 2011

David J. Kappos
*Director of the United States Patent and Trademark Office*